(12) United States Patent
Ashry Othman

(10) Patent No.: US 9,882,549 B2
(45) Date of Patent: Jan. 30, 2018

(54) APPARATUS AND METHODS FOR HIGH LINEARITY VOLTAGE VARIABLE ATTENUATORS

(71) Applicant: ANALOG DEVICES GLOBAL, Hamilton (BM)

(72) Inventor: Ahmed Mohammad Ashry Othman, Cairo (EG)

(73) Assignee: Analog Devices Global, Hamilton (BM)

( * ) Notice: Subject to any disclaimer, the term of this patent is extended or adjusted under 35 U.S.C. 154(b) by 44 days.

(21) Appl. No.: 15/050,875

(22) Filed: Feb. 23, 2016

(65) Prior Publication Data
US 2017/0244388 A1  Aug. 24, 2017

(51) Int. Cl.
*H03H 11/24* (2006.01)
(52) U.S. Cl.
CPC ................................. *H03H 11/245* (2013.01)
(58) Field of Classification Search
CPC ........ H03H 11/245; H03H 11/24; H03H 7/24; H03H 7/25
USPC ...................... 333/81 R, 81 A; 327/308, 309
See application file for complete search history.

(56) References Cited

U.S. PATENT DOCUMENTS

| 4,875,023 A | 10/1989 | Maoz |
|---|---|---|
| 5,021,747 A | 6/1991 | Isham et al. |
| 5,929,719 A | 7/1999 | Turner |
| 6,147,568 A | 11/2000 | Souetinov |
| 6,504,416 B1 | 1/2003 | Mariani |
| 7,205,817 B1 | 4/2007 | Huang et al. |
| 7,253,700 B1 * | 8/2007 | Chiu ..................... H03G 1/0088 327/308 |
| 7,505,748 B2 * | 3/2009 | McCarthy .............. H03G 1/007 333/81 R |
| 8,614,597 B2 | 12/2013 | Zhang |
| 8,633,754 B2 | 1/2014 | Granger-Jones et al. |
| 2004/0263234 A1 | 12/2004 | Mason |
| 2007/0200204 A1 | 8/2007 | Suzuki et al. |

OTHER PUBLICATIONS

Dogan et al., "A DC-2.5GHz Wide Dynamic-Range Attenuator in 0.13 μm CMOS Technology," Symposium on VLSI Circuits Digest of Technical Papers, 2005, 4 pages.

(Continued)

*Primary Examiner* — Stephen E Jones
(74) *Attorney, Agent, or Firm* — Knobbe Martens Olson & Bear LLP

(57) ABSTRACT

Provided herein are apparatus and methods for high linearity voltage variable attenuators (VVAs). In certain configurations, a high linearity VVA includes multiple shunt arms or circuits that operate in parallel with one another between a signal node and a first DC voltage, such as ground. Thus, the shunt arms are in shunt with respect to a signal path of the VVA. The multiple shunt arms include a first shunt arm of one or more n-type field effect transistor (NFETs) and a second shunt arm of one or more p-type field effect transistor (PFETs). The gates of the NFETs are controlled using a control voltage, and the gates of the PFETs are controlled using a complementary control voltage that changes inversely with respect to the control voltage.

20 Claims, 6 Drawing Sheets

(56) References Cited

OTHER PUBLICATIONS

Franzwa et al., "A 50MHz-16GHz Low Distortion SOI Voltage Controlled Attenuator IC with IIP3 >+38dBm and Control Range of > 25dB," RFMD, 2012, 20 pages.

Min, Byungwook., "SiGe/CMOS Millimeter-Wave Integrated Circuits and Wafer-Scale Packaging for Phased Array Systems," dissertation submitted in partial fulfillment of the requirements for the degree of Doctor of Philosophy (Electrical Engineering) in The University of Michigan, 2008, 154 pages.

Nyberg et al., "Novel Variable Attenuator pHEMT MMIC's for Millimetre Wave Radio Applications," European Microwave Week, 2002, 4 pages.

European Patent Office; Extended European Search Report dated Jul. 25, 2017, from related application European Patent Application No. 17156537.7.

Youssef, et al.; A CMOS Voltage-Controlled Linear Resistor with Wide Dynamic Range; System Theory, 1989 Proceedings, $21^{st}$ Southeastern Symposium; Mar. 26, 1989; pp. 681-683; Tallahassee, FL.

* cited by examiner

APPARATUS AND METHODS FOR HIGH LINEARITY VOLTAGE VARIABLE ATTENUATORS

BACKGROUND

Field

Embodiments of the invention relate to electronic circuits, and more particularly, to voltage variable attenuators.

Description of the Related Technology

A voltage variable attenuator (VVA) can be used in radio frequency (RF) applications to provide a controlled amount of attenuation to signals. The amount of attenuation, or ratio of output signal power level to input signal power level, can be adjusted by an analog attenuation control signal, such as an attenuation control voltage. In certain implementations, the attenuation control voltage is set via a feedback loop.

In one application, a VVA is used in a transceiver to adjust the signal strength of an RF signal that is amplified by a power amplifier. Thus, a VVA can be used to control a transceiver's transmit power. In another application, a VVA is used in a transceiver to provide attenuation to the output of a low noise amplifier (LNA), and the VVA's attenuation is controlled via feedback to regulate the power level of a received signal.

SUMMARY

In one aspect, a radio frequency (RF) system includes a voltage variable attenuator (VVA). The VVA includes an input terminal, an output terminal, a control circuit, a first shunt circuit, and a second shunt circuit. The control circuit is configured to control an amount of attenuation along a signal path through the VVA between the input terminal and the output terminal, and to generate a first control voltage and a first complementary control voltage that changes inversely with respect to the first control voltage. The first shunt circuit is electrically connected in shunt to the signal path, and includes at least one n-type field effect transistor (NFET) having a gate biased by the first control voltage. The second shunt circuit is electrically connected in shunt to the signal path, and includes at least one p-type field effect transistor (PFET) having a gate biased by the first complementary control voltage.

In another aspect, a method of signal attenuation is provided. The method includes propagating an RF signal along a signal path through a VVA, providing a first amount of attenuation to the RF signal using a first shunt circuit that is electrically connected in shunt to the signal path, and providing a second amount of attenuation to the RF signal using a second shunt circuit that is electrically connected in shunt to the signal path. The first shunt circuit includes at least one NFET, and the second shunt circuit includes at least one PFET. The method further includes generating a control voltage and a complementary control voltage that changes inversely with respect to the control voltage using a control circuit, biasing a gate of the at least one NFET using the control voltage, and biasing a gate of the at least one PFET using the complementary control voltage.

In another aspect, a VVA is provided. The VVA includes a control circuit configured to control an amount of attenuation of the VVA, and to generate a control voltage and a complementary control voltage that changes inversely with respect to the control voltage. The VVA further includes a shunt attenuation circuit including a first shunt circuit, a first DC blocking capacitor, a second shunt circuit, and a second DC blocking capacitor. The first shunt circuit is electrically connected between a signal node and a first DC voltage, and includes at least one NFET having a gate biased by the control voltage. The first DC blocking capacitor is electrically connected between the signal node and a first internal node, and the second shunt circuit is electrically connected between the first internal node and a second internal node. The second shunt circuit includes at least one PFET having a gate biased by the complementary control voltage, and the second DC blocking capacitor is electrically connected between the second internal node and the first DC voltage.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
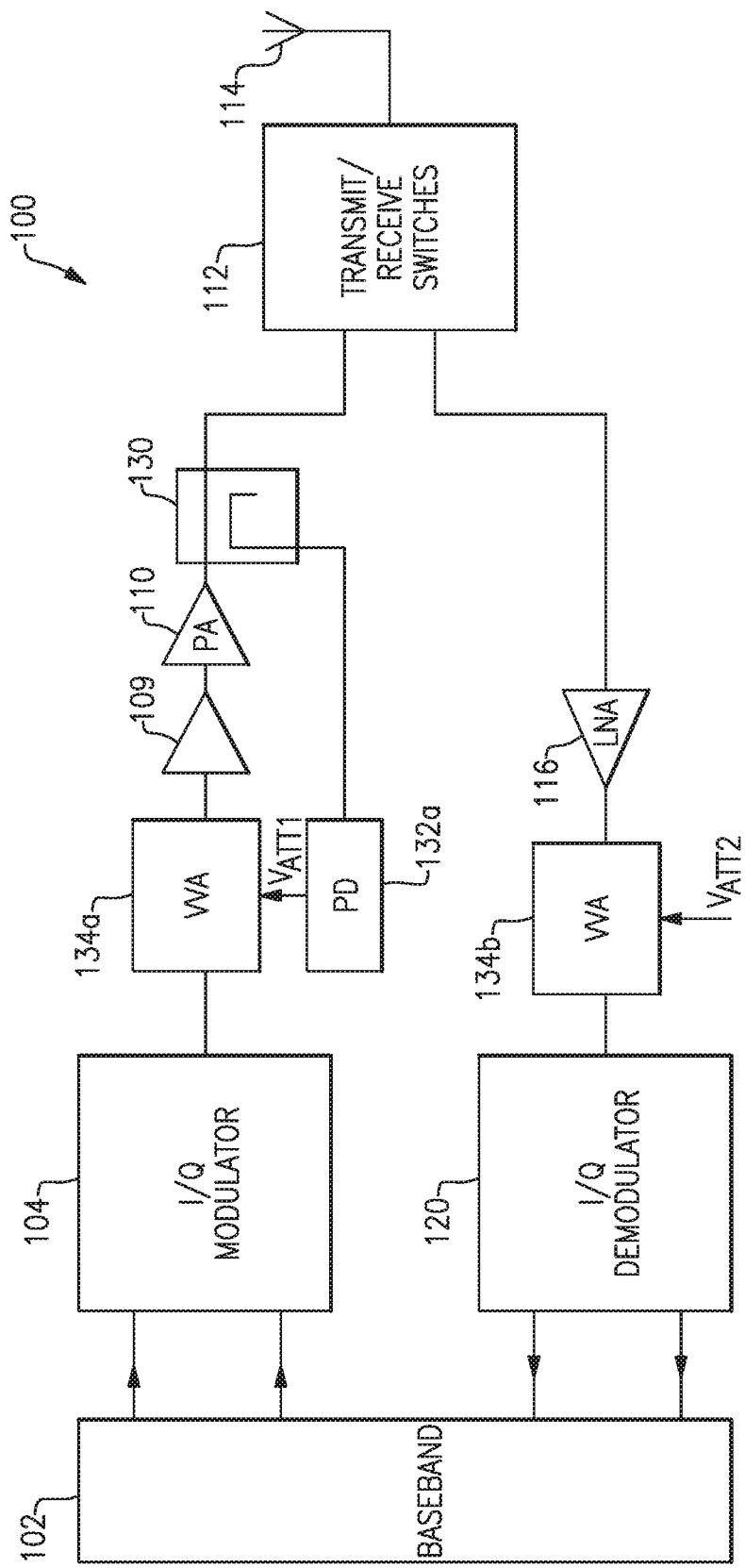
FIG. 1 is a schematic diagram of one embodiment of an RF transceiver system including high linearity voltage variable attenuators (VVAs).

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Radio frequency (RF) systems can be used to process signals of variable strength or power level. An RF system can include one or more voltage variable attenuators (VVAs) to provide gain control in transmit and/or receive signal paths.

For instance, in mobile communications, the power level of a received signal can depend on a wide variety of factors, such as the distance between a base station and a mobile device. Thus, a VVA can be used in a base station and/or mobile device to provide gain control to regulate the power level of the received signals. In another example, a base station and/or mobile device can include a VVA used to control the output power of transmitted signals. For instance, the VVA can be used to control the power level of an RF signal amplified by a power amplifier. By controlling the power level of transmissions, the link between the mobile device and the base station can be effectively maintained.

VVAs, also known as passive variable attenuators, can be used within an RF system to reduce the amplitude or power of an RF signal. Ideally, a VVA operates with high linearity, such that the VVA provides controllable attenuation with relatively low signal distortion. A VVA can be implemented using circuit elements, such as field effect transistors (FETs), to provide variable resistance that is controllable by one or more analog attenuation control signals, such as attenuation control voltages. It is desirable for a VVA to operate with high linearity, low distortion, and/or low insertion loss.

Third-order intercept point (IP3) and third-order intermodulation (IM3) are measures of linearity, and are often used as figures of merit with respect to a VVA. At a given attenuation setting, a VVA with high linearity provides about the same of amount of attenuation to a small RF signal as to a large RF signal. Thus, it is a desirable for the VVA's attenuation to be substantially constant with respect to changes in RF signal amplitude or power level. IP3 and IM3 are two example measures of a VVA's linearity.

For example, IP3 is a mathematical interception point on a log axes of first-order and third-order lines derived from a plot of attenuator output signal power versus attenuator input signal power. A VVA with a large IP3 in dBm has a high degree of linearity. IM3 can be analyzed by observing the output signal power from the VVA in the frequency domain in response to a two-tone input signal. Additionally, the IM3 can correspond to a difference between output power of a fundamental tone relative to output power of a third-order tone arising from distortion products. IM3 measured in dBc can be referred to as the IM3 relative to carrier or simply IM3 in dBc. A VVA with a large IM3 in dBc has a high degree of linearity.

A VVA can include a shunt circuit with multiple field effect transistors (FETs) in series, and a control voltage provided to the gates of the FETs can determine an on-state resistance (Ron) of the FETs and a corresponding attenuation of the VVA. Implementing a VVA to include multiple FETs in series can enhance linearity by dividing the input signal across several FETs, thereby reducing the impact of RF signal amplitude on the amount of attenuation provided by the VVA. Although connecting multiple FETs in series can improve a VVA's linearity, such a technique alone may be insufficient to meet a VVA's linearity specifications.

Provided herein are apparatus and methods for high linearity VVAs. In certain configurations, a VVA includes multiple shunt arms or circuits that operate in parallel with one another between a signal node and a first DC voltage, such as ground. Thus, the shunt arms are in shunt with respect to a signal path of the VVA. The multiple shunt arms include a first shunt arm of one or more n-type field effect transistor (NFETs) and a second shunt arm of one or more p-type field effect transistor (PFETs). In certain implementations, the first shunt arm includes two or more NFETs electrically connected in series, and the second shunt arm includes two or more PFETs electrically connected in series. The gates of the NFETs are controlled using a control voltage, and the gates of the PFETs are controlled using a complementary control voltage that changes inversely with respect to the control voltage.

By using a shunt path of series cascaded NFETs and a shunt path of series cascaded PFETs, a VVA having enhanced linearity and high IP3 can be realized. For example, applying a control voltage to the gates of the NFETs and a complementary control voltage to the gates of the PFETs increases overall linearity and IP3 relative to a configuration using a single shunt arm. In particular, PFETs and NFETs can exhibit complementary behavior with respect to non-linearity induced by variation in RF signal amplitude. Accordingly, including a first shunt arm of NFETs controlled by a control voltage and a second shunt arm of PFETs controlled by a complementary control voltage can substantially cancel the non-linearity arising from a change in RF signal amplitude.

In certain implementations, the VVA includes a control circuit that generates a control voltage having a voltage level $V_C$ for the gates of the NFETs and that generates a complementary control voltage having a voltage level of about $V_2-V_C$ for the gates of the PFETs, where $V_2$ is a DC voltage, such as a power high supply voltage. Additionally, the control circuit receives an analog attenuation control signal, which the control circuit uses to generate the control voltage and the complementary control voltage. The analog attenuation control signal operates over an analog tuning range, thereby allowing fine-tuned control over the amount of attenuation provided by the VVA. As the analog attenuation control signal is changed from one value to another, the VVA's control circuit generates the control voltage and complementary control voltage with different voltage levels to change the amount of attenuation provided by the VVA. In one embodiment, the VVA's control circuit is implemented using amplifier circuitry that generates the control voltage and the complementary control voltage based on the analog attenuation control signal using amplifier techniques.

In certain configurations, the VVA operates with high linearity across a full range of an analog attenuation control signal. Implementing a VVA in this manner can enhance the VVA's performance by maintaining signal integrity across a full operating range of the VVA and/or ease implementation of a feedback loop, such as an automatic gain control (AGC) loop, used to control the VVA's attenuation.

The VVAs described herein can be used to provide controllable attenuation in a wide range of applications, including, for example, cellular, microwave, very small aperture terminal (VSAT), test equipment, and/or sensor applications. The VVAs can provide attenuation to signals of a variety of frequencies, including not only those used for cellular communications, such as 3G, 4G, WiMAX, LTE, and Advanced LTE communications, but also to higher frequencies, such as those in the X band (about 7 GHz to 12 GHz), the $K_u$ band (about 12 GHz to 18 GHz), the K band (about 18 GHz to 27 GHz), and/or the $K_a$ band (about 27 GHz to 40 GHz). Accordingly, the teachings herein are applicable to a wide variety of RF systems, including microwave communication systems.

FIG. 1 is a schematic diagram of one embodiment of an RF transceiver system 100. The RF transceiver system 100 includes a baseband system 102, an I/Q modulator 104, an I/Q demodulator 120, a first high linearity VVA 134a, a second high linearity VVA 134b, a power detector (PD) 132a, a preamplifier 109, a power amplifier (PA) 110, a directional coupler 130, transmit/receive switches 112, an RF antenna 114, and a low noise amplifier (LNA) 116.

Baseband I/Q signals generated by the baseband system 102 are modulated within the I/Q modulator 104 and follow a forward signal path through the first high linearity VVA 134a, the preamplifier 109, the PA 110, the directional coupler 130, and into the transmit/receive switches 112. The transmit/receive switches 112 can selectively pass the signal to the RF antenna 114. The forward signal path is also referred to as a transmit signal path.

The coupler 130 can feedback a sample from the output of the PA 110 to the PD 132a. The power detector 132a can, in turn, based upon the sample, provide a first analog attenuation control signal $V_{ATT1}$ to the first high linearity VVA 134a so as to control the amount of attenuation of a signal received by the preamplifier 109. The first analog attenuation control signal $V_{ATT1}$ changes in relation to an output power of the PA 110. In this way the output power of the PA 110 is regulated, and the transmit signal path operates with adaptive power control.

In FIG. 1, the transmit/receive switches 112 can also pass a received RF signal from antenna 114 along a return signal path through the transmit/receive switches 112, the LNA 116, the second high linearity VVA 134b, and into the I/Q demodulator 120, which provides demodulated I/Q signals to the baseband system 102. The return signal path is also referred to as a receive signal path.

As shown in FIG. 1, a second analog attenuation control signal $V_{ATT2}$ is applied to the second high linearity VVA 134b so as to control the amount of attenuation of an output signal provided from the LNA 116. In this way the output power of the LNA 116 has power control for enhancing the receiver signal path performance and controlling the power of signals received by the RF transceiver system 100. For instance, if the strength of the output signal from the LNA 116 is too large, then the second analog attenuation control signal $V_{ATT2}$ can be used to increase attenuation by the second high linearity VVA 134b, thereby reducing receive signal power. Likewise, if the strength of the signal received by the LNA 116 is too small, then the second attenuation control signal $V_{ATT2}$ can be used to reduce attenuation by the second high linearity VVA 134b, thereby increasing receive signal power.

Although the second high linearity VVA 134b is illustrated in an open loop configuration, the second analog attenuation control signal $V_{ATT2}$ can be provided to the second high linearity VVA 134b using a control loop.

In the design of transceivers, such as the RF transceiver system 100, overall linearity of the transceiver is affected by the linearity of each individual component. By using the high linearity VVAs 134a, 134b, an RF transceiver system can exhibit improved linear performance with respect to variations in RF signal levels. As further described below, a high linearity VVA can compensate for nonlinearity arising from variations in RF signal levels, which in turn improves figures of merit related to linearity, such as IM3 and IP3.

Although, the RF transceiver system 100 illustrates one example of an RF system that can include high linearity VVAs as described herein, one or more high linearity VVAs can be used in other configurations of RF systems, including, for example, microwave communications systems. Additionally, although a particular configuration of components is illustrated in FIG. 1, the RF transceiver system 100 can be adapted and modified in a wide variety of ways. For example, the RF transceiver system 100 can include more or fewer receive and/or transmit paths. Additionally, the RF transceiver system 100 can be modified to include more or fewer components and/or a different arrangement of components, including, for example, a different arrangement of VVAs.

Figure 2A:
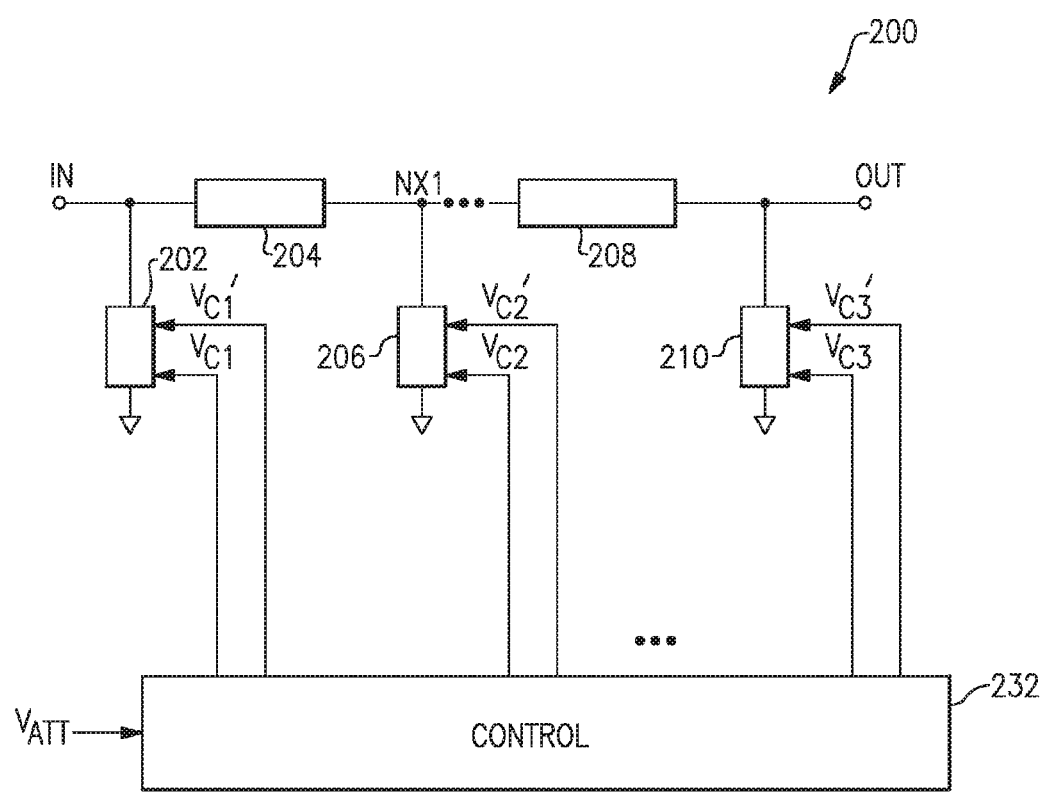
FIG. 2A is a circuit diagram of a VVA according to one embodiment.

FIG. 2A is a circuit diagram of a VVA 200 according to one embodiment. The VVA 200 includes a first shunt attenuation circuit 202, a second shunt attenuation circuit 206, a third shunt attenuation circuit 210, a first series circuit 204, a second series circuit 208, and a control circuit 232. The VVA 200 receives an input signal on an input terminal IN, and provides an attenuated output signal on an output terminal OUT. The VVA 200 also receives an analog attenuation control signal $V_{ATT}$, which is used to control an amount of attenuation of the VVA 200 from the input terminal IN to the output terminal OUT.

Although the VVA 200 of FIG. 2A illustrates one embodiment of a high linearity VVA, the teachings herein are applicable to a wide variety of configurations. For example, a high linearity VVA can include more or fewer shunt attenuation circuits and/or series circuits, and/or circuitry can be arranged in other ways.

In the illustrated embodiment, the first series circuit 204 and the second series circuit 208 are electrically connected in series in a signal path between the input terminal IN and the output terminal OUT. As shown in FIG. 2A, the signal path includes a node NX1 between the first and second series circuits 204, 208. Additionally, the first shunt attenuation circuit 202 is electrically connected between the input terminal IN and a DC voltage, which can be, for example, ground. Additionally, the second shunt attenuation circuit 206 is electrically connected between the node NX1 and the DC voltage. Furthermore, the third shunt attenuation circuit 210 is electrically connected between the output terminal OUT and the DC voltage.

The control circuit 232 receives the analog attenuation control signal $V_{ATT}$, and generates various control voltages for the shunt attenuation circuits. In the illustrated embodiment, the control circuit 232 generates a first control voltage $V_{C1}$ and a first complementary control voltage $V_{C1}'$ used to bias the first shunt attenuation circuit 202. Additionally, the control circuit 232 generates a second control voltage $V_{C2}$ and a second complementary control voltage $V_{C2}'$ used to bias the second shunt attenuation circuit 206. Furthermore, the control circuit 232 generates a third control voltage $V_{C3}$ and a third complementary control voltage $V_{C3}'$ used to bias the third shunt attenuation circuit 210. Although FIG. 2A illustrates an embodiment in which the control circuit 232 generates two control voltages for each shunt attenuation circuit, other configurations are possible. For example, in another embodiment, a common control voltage and a common complementary control voltage are used to bias two or more of the shunt attenuation circuits.

In the illustrated embodiment, the control circuit 232 generates the complementary control voltages $V_{C1}'$-$V_{C3}'$ to vary inversely in relation to the control voltages $V_{C1}$-$V_{C3}$, respectively. Additionally, both the control voltages $V_{C1}$-$V_{C3}$ and the complementary control voltages $V_{C1}'$-$V_{C3}'$ are generated based on a value of the analog attenuation control signal $V_{ATT}$. In certain configurations, when the analog attenuation control signal $V_{ATT}$ increases, each of the control voltages $V_{C1}$-$V_{C3}$ increase and each of the complementary control voltages $V_{C1}'$-$V_{C3}'$ decrease. In other configurations, when the analog attenuation control signal $V_{ATT}$ increases, each of the control voltages $V_{C1}$-$V_{C3}$ decrease and each of the complementary control voltages $V_{C1}'$-$V_{C3}'$ increase. In one embodiment, each of the control voltages $V_{C1}$-$V_{C3}$ and the complementary control voltages $V_{C1}'$-$V_{C3}'$ change substantially linearly with respect to the analog attenuation control signal $V_{ATT}$, such that each control voltage or complementary control voltage is either substantially proportionate to or inversely proportionate to the analog attenuation control signal $V_{ATT}$.

In certain configurations, the shunt attenuation circuits 202, 206, 210 each include an NFET shunt arm and a PFET shunt arm that operate in parallel with one another and in shunt to the VVA's signal path. Each NFET shunt arm includes one or more NFETs in series, and each PFET shunt arm includes one or more PFETs in series. Additionally, the control voltages $V_{C1}$-$V_{C3}$ are used to bias gates of the NFET shunt arms, and the complementary control voltages $V_{C1}'$-$V_{C3}'$ are used to bias gates of PFET shunt arms. Configuring the control circuit 232 in this manner enhances the linearity of the VVA 200 by providing cancellation of non-linear effects arising from variation in RF signal level, as described in detail herein.

Accordingly, based on the analog attenuation control signal $V_{ATT}$, the control circuit 232 uses control voltages $V_{C1}$-$V_{C3}$ and complementary control voltages $V_{C1}'$-$V_{C3}'$ to regulate an attenuation level or amount of an RF signal propagating between the input terminal IN and the output OUT of the high linearity VVA 200.

The illustrated shunt attenuation circuits 202, 206, 210 and series circuits 204, 208 can include components, such as stripline, passive devices, and/or active devices, which are arranged to control attenuation characteristics of the VVA 200. For example, the shunt attenuation circuits 202, 206, 210 and series circuits 204, 208 can be implemented to provide a desired range of attenuation values over a tuning range of the analog attenuation control signal $V_{ATT}$. The circuits can also be implemented to provide robust performance across a range of signal frequencies and/or to provide a relatively small phase variation from input to output for different attenuation control signal values.

In one embodiment, the series circuits 204, 208 include an inductor, a capacitor, a resistor, or combinations thereof.

As shown in FIG. 2A, a corresponding pair of the control voltages $V_{C1}$-$V_{C3}$ and the complementary control voltages $V_{C1}'$-$V_{C3}'$ control an attenuation of a particular shunt attenuation circuit. For instance, an amount of impedance or attenuation of the first shunt attenuation circuit 202 is controlled by the first control voltage $V_{C1}$ and the first complementary control voltage $V_{C1}'$. As described earlier, the attenuation can be controlled in an analog manner whereby the first control voltage $V_{C1}$ and the first complementary control voltage $V_{C1}'$ are analog voltages that are based on a value of the analog attenuation control signal $V_{ATT}$.

Although the embodiment of FIG. 2A shows a high linearity VVA 200 having first and second series circuits 204 and 208 and first, second, and third shunt attenuation circuits 202, 206, and 210, respectively, other configurations are possible. For instance, other embodiments can use one shunt attenuation circuit, with or without one or more series circuits.

Additional details of the VVA 200 of FIG. 2A can be as described herein.

Figure 2B:
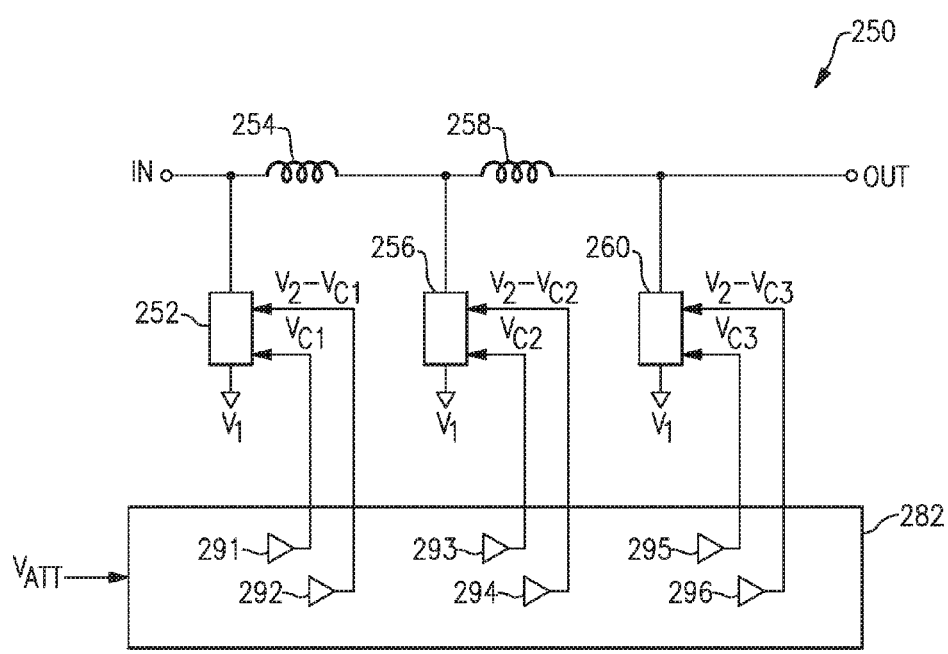
FIG. 2B is a circuit diagram of a VVA according to another embodiment.

FIG. 2B is a circuit diagram of a VVA 250 according to another embodiment. The VVA 250 includes a first shunt attenuation circuit 252, a second shunt attenuation circuit 256, a third shunt attenuation circuit 260, a first series inductor 254, a second series inductor 258, and a control circuit 282. The VVA 250 receives an input signal on an input terminal IN, and provides an attenuated output signal on an output terminal OUT. The VVA 250 also receives an analog attenuation control signal $V_{ATT}$, which is used to control an amount of attenuation of the VVA 250 from the input terminal IN to the output terminal OUT.

In the illustrated embodiment, the first series inductor 254 and the second series inductor 258 are electrically connected in series in a signal path between the input terminal IN and the output terminal OUT. The first shunt attenuation circuit 252 is electrically connected between the input terminal IN and a first DC voltage $V_1$, which can be, for example, ground. Additionally, the second shunt attenuation circuit 256 is electrically connected between the first DC voltage $V_1$ and a node of the signal path that is between the series inductors 254, 258. Furthermore, the third shunt attenuation circuit 260 is electrically connected between the output terminal OUT and the first DC voltage $V_1$.

The control circuit 282 receives the analog attenuation control signal $V_{ATT}$, and generates various control voltages for the shunt attenuation circuits. In the illustrated embodiment, the control circuit 282 generates a first control voltage $V_{C1}$ and a first complementary control voltage $V_2$-$V_{C1}$ used to bias the first shunt attenuation circuit 252, where $V_2$ is the voltage level of a second DC voltage, such as a power high supply. Additionally, the control circuit 282 generates a second control voltage $V_{C2}$ and a second complementary control voltage $V_2$-$V_{C2}$ used to bias the second shunt attenuation circuit 256. Furthermore, the control circuit 282 generates a third control voltage $V_{C3}$ and a third complementary control voltage $V_2$-$V_{C3}$ used to bias the third shunt attenuation circuit 260.

In the illustrated embodiment, the control circuit 282 is implemented as an amplifier-based circuit that uses amplifier techniques to generate the control voltages and complementary control voltages. As shown in FIG. 2B, the illustrated control circuit 282 includes a first amplifier circuit 291 that generates the first control voltage $V_{C1}$, a second amplifier circuit 292 that generates the first complementary control voltage $V_2$-$V_{C1}$, a third amplifier circuit 293 that generates the second control voltage $V_{C2}$, a fourth amplifier circuit 294 that generates the second complementary control voltage $V_2$-$V_{C2}$, a fifth amplifier circuit 295 that generates the third control voltage $V_{C3}$, and a sixth amplifier circuit 296 that generates the third complementary control voltage $V_2$-$V_{C3}$. Although FIG. 2B illustrates one embodiment of an amplifier-based control circuit, other control circuit configurations are possible.

Additional details of the VVA 250 of FIG. 2B can be as described herein.

Figure 3:
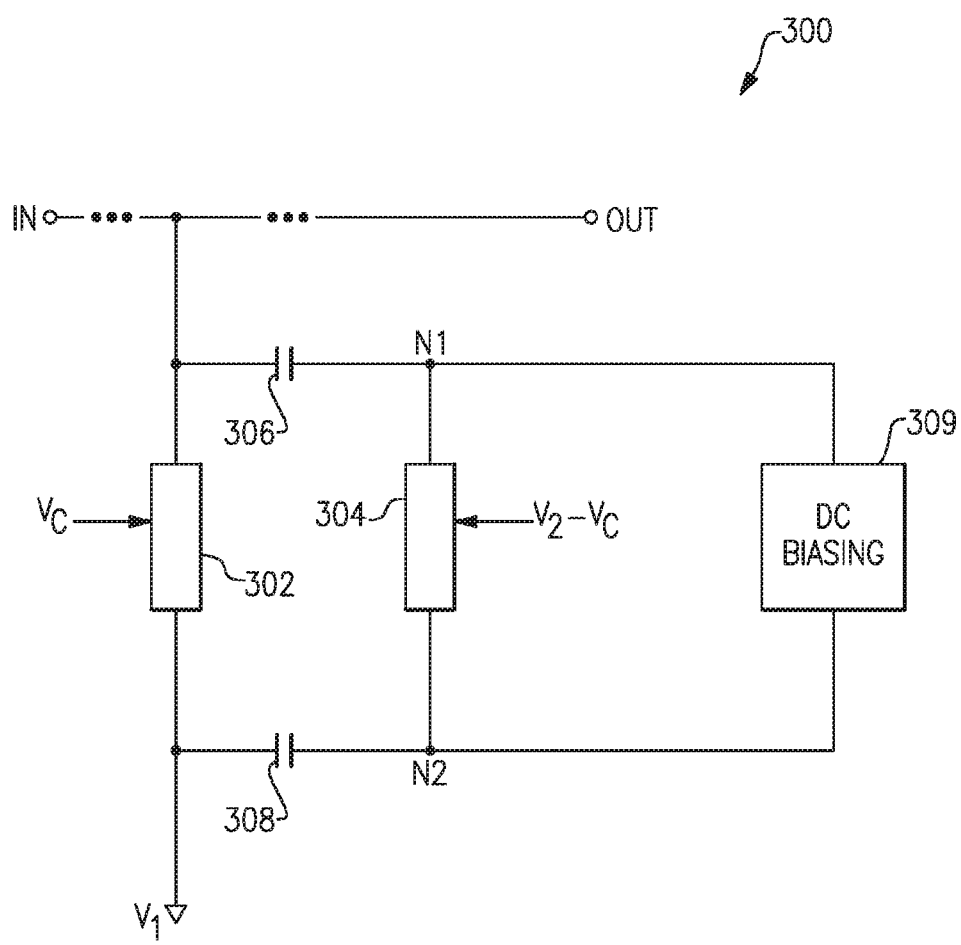
FIG. 3 is a circuit diagram of a shunt attenuation circuit for a high linearity VVA according to one embodiment.

FIG. 3 is a circuit diagram of a shunt attenuation circuit 300 for a high linearity VVA according to one embodiment. The shunt attenuation circuit 300 includes a first shunt circuit or arm 302 and a second shunt circuit or arm 304. The shunt attenuation circuit 300 further includes a first DC blocking capacitor 306, a second DC blocking capacitor 308 and a DC biasing block or circuit 309. The shunt attenuation circuit 300 is electrically connected in shunt with respect to a signal path between an input terminal IN and an output terminal OUT.

In the embodiment of FIG. 3, the input terminal IN and the output terminal OUT are shown as being directly connected together. However, other configurations are possible. For instance, in some configurations one or more series circuits, such as inductors and/or other circuit elements, are electrically connected between the input terminal IN and the output terminal OUT.

As shown in FIG. 3, the first shunt circuit 302 is electrically connected between a signal path node and a first DC voltage $V_1$, and receives a control voltage $V_C$ that controls an amount of attenuation provided by the first shunt circuit 302. The second or complementary shunt circuit 304 is also electrically connected between the signal path node and a first DC voltage $V_1$, and operates in parallel with the first shunt circuit 302. The second shunt circuit 304 receives a complementary control voltage $V_2$-$V_C$, where $V_2$ is the voltage level of a second DC voltage. Thus, the complementary control voltage has a voltage level based on a difference between the second DC voltage $V_2$ and the control voltage $V_C$, and thus varies inversely with respect to the control voltage $V_C$.

In certain configurations, the first DC voltage $V_1$ is a ground voltage and the second DC voltage $V_2$ is a power high supply voltage. In other configurations, the first DC voltage $V_1$ is a ground voltage and the second DC voltage $V_2$ is a reference voltage. Although two example configurations of the first and second DC voltages $V_1$, $V_2$ have been provided, the first and second DC voltages $V_1$, $V_2$ can be generated in a wide variety of ways.

To provide separate DC bias voltages for the second shunt circuit 304 relative to the first shunt circuit 302, the DC biasing circuit 309 and first and second DC blocking capacitors 306, 308 have been included. As shown in FIG. 3, the first DC blocking capacitor 306 is electrically connected between the signal path node and a first internal node N1, and the second DC blocking capacitor 308 is electrically connected between the first DC voltage $V_1$ and a second internal node N2. Additionally, the second shunt circuit 304 is electrically connected between the first internal node N1 and the second internal node N2. Thus, the first DC blocking capacitor 306, the second shunt circuit 304, and the second DC blocking capacitor 308 are electrically connected in series between the signal path node and first DC voltage $V_1$, in this embodiment.

The DC biasing circuit 309 is electrically connected between the first internal node N1 and the second internal node N2, and controls the DC bias voltages of the first internal node N1 and the second internal node N2. In certain configurations, the DC biasing circuit 309 further provides DC biasing to one or more internal nodes of the first shunt circuit 302 and/or the second shunt circuit 304. In one embodiment, the DC biasing circuit 309 biases the first internal node N1 and the second internal node N2 with a DC biasing voltage that is about equal to the second DC voltage $V_2$. As shown in FIG. 3, the first shunt circuit 302 is biased using the first DC voltage $V_1$. In certain configurations, the signal path between the input terminal IN and the output terminal OUT is also biased using the first DC voltage $V_1$.

The shunt attenuation circuit 300 can attenuate an RF signal, which propagates between the input terminal IN and the output terminal OUT, as a function of the control voltage $V_C$. The control voltage $V_C$ and complementary control voltage $V_2$-$V_C$ can be generated by a control circuit based on an analog attenuation control signal, as was described earlier with respect to FIGS. 2A and 2B. The control voltage $V_C$ can provide a voltage level for biasing circuit elements, such as transistors, within the first shunt circuit 302, and the complementary control voltage $V_2$-$V_C$ can provide a voltage level for biasing circuit elements, such as transistors, within the second shunt circuit 304. In one embodiment, the first shunt circuit 302 includes two or more NFETs electrically connected in series, and the second shunt circuit 304 includes two or more PFETs electrically connected in series. In certain configurations, the two or more NFETs are implemented as n-type metal oxide semiconductor (NMOS) transistors, and the two or more PFETs are implemented as p-type metal oxide semiconductor (PMOS) transistors.

In one embodiment, the DC biasing circuit 309 provides the second DC voltage $V_2$ to the complementary shunt circuit 304 at the first internal node N1 and the second internal node N2. The first DC blocking capacitor 306 and the second DC blocking capacitor 308 operate to provide DC (direct current) blocking between the first shunt circuit 302 and the second shunt circuit 304 for DC and frequencies lower than a cutoff frequency, and to provide high frequency coupling for RF signals greater than a cutoff frequency. In this way the first shunt circuit 302 can be biased relative to the first DC voltage $V_1$, while the second shunt circuit 304 can be biased relative to the second DC voltage $V_2$. For instance, the first DC voltage $V_1$ can be ground (0 V DC), while the second DC voltage $V_2$ can be a positive supply (for example, 12 V DC). In this way, elements of the first shunt circuit 302 can be biased by the control voltage $V_C$ relative to the first DC voltage $V_1$, while elements of the second shunt circuit 304 can be biased in a complementary manner by the complementary control voltage $V_2$-$V_C$ relative to the second DC voltage $V_2$.

The attenuation, or attenuation level, provided by the first shunt circuit 302 can be determined in part by the magnitude of the control voltage $V_C$ relative to the first DC voltage $V_1$. As previously described, the control voltage $V_C$ can be controlled in an analog manner so as to vary attenuation in an analog manner. In the steady state the control voltage $V_C$ can be controlled to cause the first shunt circuit 302 to have a constant attenuation. Amplitude and power variations of the RF signal between the input terminal IN and the output terminal OUT can also cause the attenuation of the first shunt circuit 302 to vary, thereby leading to nonlinear behavior.

Similarly, the attenuation, or attenuation level, of the second shunt circuit 304 can be determined in part by the magnitude of the control voltage $V_C$ relative to the second DC voltage $V_2$. The control voltage $V_C$ can be controlled as an analog signal so as to provide continuous analog control of the attenuation, and in the steady state the control voltage $V_C$ can be controlled to operate the second shunt circuit 304 with a constant attenuation. Additionally, variations of the RF signal at the input terminal can cause a complementary variation in attenuation of the complementary shunt circuit 304, thereby leading to nonlinear behavior.

For RF signals operating with frequency greater than the cutoff frequency, the first and second DC blocking capacitors 306, 308 can couple the first and second internal nodes N1 and N2 such that the first shunt circuit 302 and the second shunt circuit 304 are electrically connected in parallel for RF signals.

Accordingly, the total attenuation of an RF signal propagating from the input terminal IN to the output terminal OUT is based on the parallel operation of the first shunt circuit 302 with the second shunt circuit 304. Advantageously, the parallel operation of the first and second shunt circuits 302, 304 allows for a canceling or compensation of the variations in attenuation due to variations in the RF signal. In particular, variations in attenuation of the second shunt circuit 304 due to variations of the RF signal level are opposite or complementary to variations in attenuation of the first shunt circuit 302 due to variations of the RF signal level. Thus, nonlinear effects of the first and second shunt circuit 302, 304 are complementary, and the net variation in attenuation of the overall shunt attenuation circuit 300 is less than the individual variations in attenuation of either the first shunt circuit 302 or the second shunt circuit 304.

In this way, when operating in parallel, the first shunt circuit 302 and the second shunt circuit 304 operate to provide the shunt attenuation circuit 300 with enhanced linearity. Accordingly, when one or more instantiations of the shunt attenuation circuit 300 operate in a signal path of a VVA, the VVA exhibits high linearity, including, for example, high IP3 and/or IM3.

Additional details of the shunt attenuation circuit 300 can be as described herein.

Figure 4:
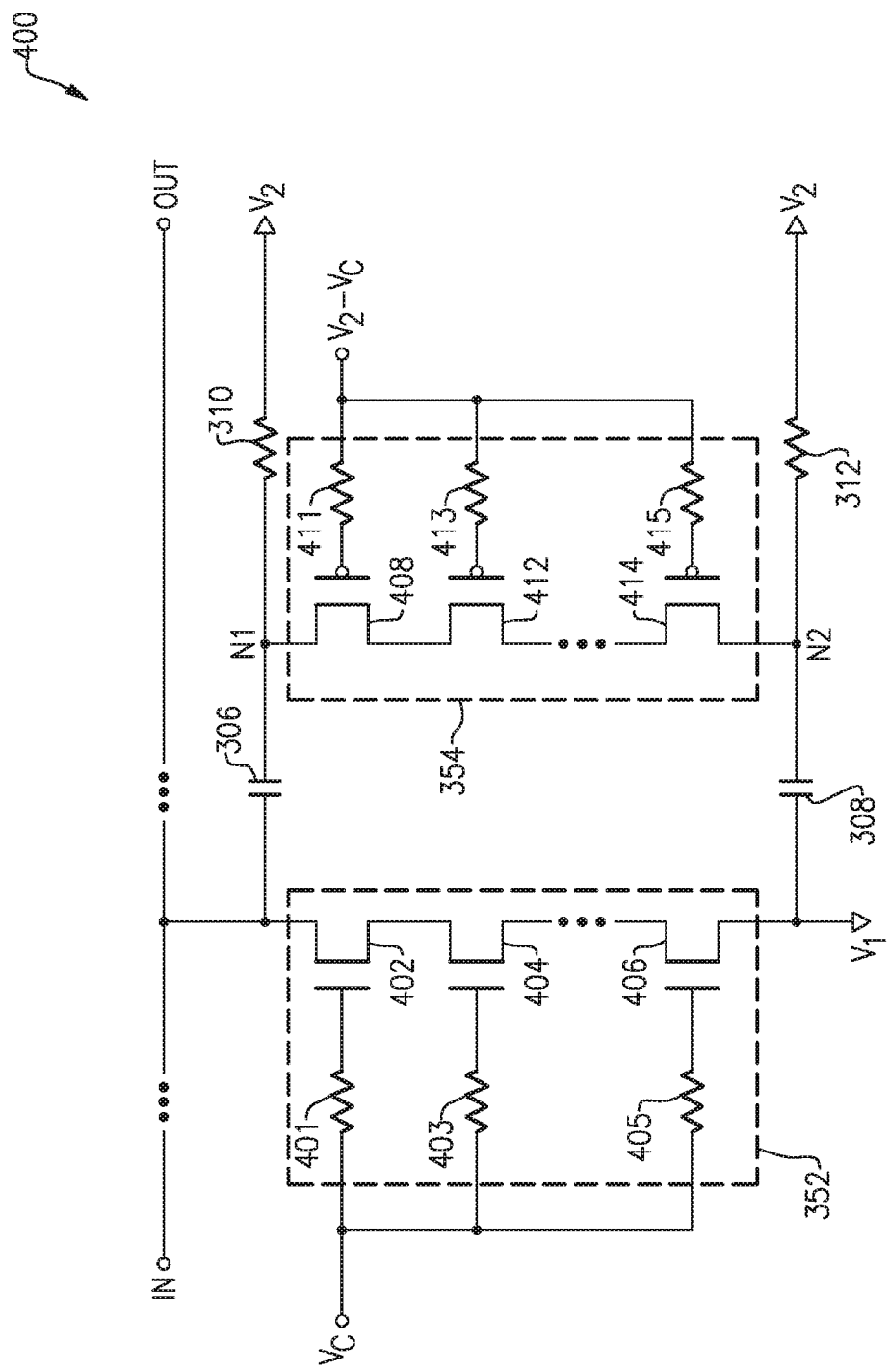
FIG. 4 is a circuit diagram of a shunt attenuation circuit for a high linearity VVA according to another embodiment.

FIG. 4 is a circuit diagram of a shunt attenuation circuit 400 for a high linearity VVA according to another embodiment. The shunt attenuation circuit 400 includes a first shunt circuit or arm 352 and a second shunt circuit or arm 354. The shunt attenuation circuit 400 further includes the first and second DC blocking capacitors 306, 308, which can be as described earlier. The shunt attenuation circuit 400 further includes a DC biasing circuit implemented using a first DC biasing resistor 310 and a second DC biasing resistor 312.

As shown in FIG. 4, the first shunt circuit 352 is electrically connected between a signal path node and a first DC voltage $V_1$, and receives the control voltage $V_C$. The second shunt circuit 354 is electrically connected in parallel with the first shunt circuit 352 between the signal path node and the first DC voltage $V_1$. The second shunt circuit 354 receives a complementary control signal equal to the complementary control voltage $V_2$-$V_C$.

The first DC blocking capacitor 306 is connected between the signal path node and the first internal node N1, and the second DC blocking capacitor 308 is connected between the first DC voltage $V_1$ and the second internal node N2. Also as shown, the first DC biasing resistor 310 is electrically connected between the first internal node N1 and the second DC voltage $V_2$, while the second DC biasing resistor 312 is connected between the second internal node N2 and the second DC voltage $V_2$. Thus, the first and second DC biasing resistors 310, 312 operate to control the DC bias voltage of the first and second internal nodes N1, N2 to be about equal to the second DC voltage $V_2$.

The first shunt circuit 352 includes a first NFET 402, a second NFET 404, and a third NFET 406 electrically connected in series cascade between the signal path node and the first DC voltage $V_1$. As shown in FIG. 4, a drain of the first NFET 402 is electrically connected to the signal path node, and a source of the first NFET 402 is electrically connected to a drain of the second NFET 404. Additionally, a source of the second NFET 404 is electrically connected to a drain of the third NFET 406, and a source of the third NFET 406 is electrically connected to the first DC voltage $V_1$.

Although the first shunt circuit 352 is illustrated as including three NFETs in series, the first shunt circuit 352 can be adapted to include more or fewer NFETs. In one embodiment, the first shunt circuit 352 includes from 1 to 7 NFETs in series. In another embodiment, the first shunt circuit 352 includes from 2 to 6 NFETs in series. In certain configurations, the NFETs are implemented as NMOS transistors.

The first shunt circuit 352 further includes a first gate resistor 401 electrically connected between a gate of the first NFET 402 and the control voltage $V_C$, a second gate resistor 403 electrically connected between a gate of the second NFET 404 and the control voltage $V_C$, and a third gate resistor 405 electrically connected between a gate of the third NFET 406 and the control voltage $V_C$.

The gate resistors 401, 403, 405 operate to bias the gates of the NFETS 402, 404, 406 with the control voltage $V_C$, while providing isolation between the shunt attenuation circuit 400 and a control circuit that generates the control voltage $V_C$. For example, high frequency signal components can be coupled onto the gates of the gates of the NFETS 402, 404, 406 via parasitic gain-to-drain and/or gate-to-source capacitances, and the gate resistors 401, 403, 405 can provide resistance that impedes the high frequency signal components from reaching the control circuit. Although one example of gate biasing is shown in FIG. 4, other configurations are possible.

The bodies of the first NFET 402, the second NFET 404, and the third NFET 406 can be connected in a variety of ways. In one example, the bodies of the NFETs 402, 404, 406 are electrically connected to the first DC voltage $V_1$. In another example, the NFETs are implemented as NMOS transistors in a silicon on insulator (SOI) process, and the bodies of the NMOS transistors are electrically floating.

The second shunt circuit 304 includes a first PFET 408, a second PFET 412, and a third PFET 414 connected in series cascade between the signal path node and the first DC voltage $V_1$, and thus the second shunt circuit 304 operates in parallel with the first shunt circuit 302 to provide attenuation to RF signals. To provide separate DC bias voltages for the first and second shunt circuits 352, 354, the first and second DC blocking capacitors 306, 308 have been included. The first DC blocking capacitor 306, the second shunt circuit 354, and the second DC blocking capacitor 308 are electrically connected in series between the signal path node and the first DC voltage $V_1$. In the illustrated embodiment, a source of the first PFET 408 is electrically connected to the first internal node N1 and a drain of the first PFET 408 is electrically connected to a source of the second PFET 412. Additionally, a drain of the second PFET 412 is electrically connected to a source of the third PFET 414, and a drain of the third PFET 414 is electrically connected to the second internal node N2.

Although the second shunt circuit 354 is illustrated as including three PFETs in series, the second shunt circuit 354 can be adapted to include more or fewer PFETs. In one embodiment, the second shunt circuit 354 includes from 1 to 7 PFETs in series. In another embodiment, the second shunt circuit 354 includes from 2 to 6 PFETs in series. In certain configurations, the PFETs are implemented as PMOS transistors.

The second shunt circuit 354 includes a first gate resistor 411 electrically connected between a gate of the first PFET 408 and the complementary control voltage $V_2$-$V_C$, a second gate resistor 413 electrically connected between a gate of the second PFET 412 and the complementary control voltage $V_2$-$V_C$, and a third gate resistor 415 electrically connected between a gate of the third PFET 414 and the complementary control voltage $V_2$-$V_C$. The gate resistors 411, 413, 415 operate to bias the gates of the PFETS 408, 412, 414 with the complementary control voltage $V_2$-$V_C$, while providing isolation between the shunt attenuation circuit 400 and a control circuit that generates the complementary control voltage $V_2$-$V_C$.

The bodies of the first PFET 408, the second PFET 412, and the third PFET 414 can be connected in a variety of ways. In one example, the bodies of the PFETs 408, 412, 414 are electrically connected to the second DC voltage $V_2$. In another example, the PFETs are implemented as PMOS transistors in an SOI process, and the bodies of the PMOS transistors are electrically floating.

The series cascade of NFETs of the first shunt circuit 352 provide variable impedance between the signal path node and the first DC voltage $V_1$. The drain-to-source impedance or channel resistance of each NFET can be controlled in an analog manner by the control voltage $V_C$. For example, for each NFET, the drain-to-source impedance is controlled by the gate-to-source voltage. By controlling the drain-to-source impedances of the series cascade NFETs of the first shunt circuit 352, the control voltage $V_C$ controls the attenuation of the first shunt circuit 352.

Variations in an RF signal level at the input terminal IN can also cause nonlinear behavior by causing the attenuation of the first shunt circuit 352 to vary. For instance, when an RF signal increases in power or voltage amplitude swing at the input terminal IN, each NFET within the series cascade of NFETs of the shunt circuit 352 can have gate-to-source voltage variations and/or drain-to-source voltage variations. These variations, in turn, can modulate the drain-to-source impedance of the NFETs 402, 404, 406. Variations in impedance due to the variation of an RF signal level can also be referred to as RF signal induced impedance variations. RF signal induced impedance variations can give rise to attenuation variations in the first shunt circuit 352, which in turn give rise to nonlinear behavior that can degrade a VVA's IP3 and/or IM3.

Likewise, the series cascade of PFETs of the second shunt circuit 354 provide variable impedance between the signal path node and the first DC voltage $V_1$. The drain-to-source impedance or channel resistance of each PFET can be controlled in an analog manner by the complementary control voltage $V_2$-$V_C$. For example, for each PFET, the drain-to-source impedance is controlled by the gate-to-source voltage. By controlling the drain-to-source impedances of the series cascade PFETs of the second shunt circuit 354, the complementary control voltage $V_2$-$V_C$ controls the attenuation of the second shunt circuit 354.

For RF signals operating with a frequency greater than the cutoff frequency between the input terminal IN and the output terminal OUT, the first and second DC blocking capacitors 306, 308 can couple the first and second internal nodes N1 and N2 such that the first shunt circuit 352 and the second shunt circuit 354 are electrically connected in parallel for RF signals.

Accordingly, the total attenuation of an RF signal propagating from the input terminal IN to the output terminal OUT is based on the parallel operation of the first shunt circuit 352 with the second shunt circuit 354. Advantageously, the parallel operation of the first and second shunt circuits 352, 354 allows for a canceling or compensation of the variations in attenuation due to variations in the RF signal.

For instance, when an RF signal increases in power or voltage amplitude swing at the input terminal IN, each PFET within the series cascade of PFETs of the second shunt circuit 354 can have voltage variations that modulate the drain-to-source impedance of the PFETs 408, 412, 414. Additionally, when an RF signal increases in power or voltage amplitude swing at the input terminal IN, each NFET within the series cascade of NFETs of the first shunt circuit 352 can have voltage variations that modulate the drain-to-source impedance of the NFETs 402, 404, 406. However, the RF induced impedance variations of the second shunt circuit 354 are complementary or opposite to those of the first shunt circuit 352, since the drain-to-source impedance of the PFET varies complementary to that of the NFETs. For instance, when an RF signal induced variation causes the gate-to-source voltages of the NFETs 402, 404, 406 to increase, the same RF induced variation causes the gate-to-source voltages of the PFETs 408, 412, 414 to decrease. Likewise, when an RF signal induced variation causes the gate-to-source voltages of the NFETs 402, 404, 406 to decrease, the same RF induced variation causes the gate-to-source voltages of the PFETs 408, 412, 414 to increase.

Accordingly, the parallel operation of the first and second shunt circuits 352, 354 allows for a canceling or compensation of the variations in attenuation due to variations in the RF signal. This reduction in the net variation of attenuation of the shunt attenuation circuit 400 can, in turn, improve the linear behavior compared to a VVA having only one shunt circuit.

Although the configuration of FIG. 4 shows a shunt attenuation circuit 400 including three NFETs and three PFETs, other configurations having fewer or greater NFETs and/or fewer or greater PFETs are possible. For instance, some configurations can use one NFET in the first shunt circuit 352 and/or one PFET in the second shunt circuit 354.

Additional details of the shunt attenuation circuit 400 can be as described herein.

Figure 5:
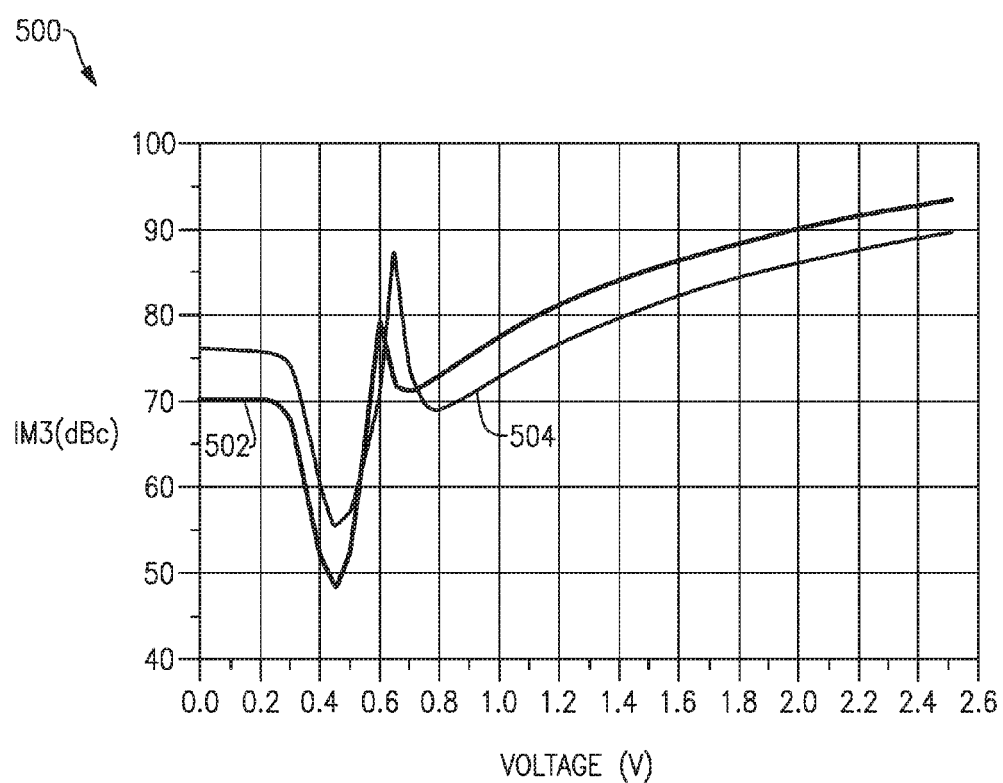
FIG. 5 is a graph of simulated third-order intermodulation (IM3) versus attenuation control voltage for two examples of VVAs.

FIG. 5 is a graph 500 of simulated IM3 versus attenuation control voltage for two examples of VVAs. The graph 500 includes a first plot 502 for simulations of a VVA having one shunt path of one NFETs and a second plot 504 for simulations of a high linearity VVA having both a first shunt path of one NFET and a second shunt path of one PFET. The high linearity VVA of the second plot 504 is controlled using both a control voltage and a complementary control voltage. Although one example of simulation results is illustrated, other results are possible, including for example, results based on process, implementation, and/or simulation parameters.

As shown in FIG. 5, the control voltage $V_C$ is a voltage signal having units of volts. Additionally, IM3 in dBc is shown as a positive quantity reflecting the degree of linearity. The lowest value, or minimum, of the plots 502 and 504 versus control voltage $V_C$ corresponds to where the attenuator exhibits greatest nonlinear behavior. From FIG. 5 it can be seen that the second plot 504 of the high linearity VVA and the first plot 502 of the VVA reach a minimum IM3 when the control voltage $V_C$ is about 0.45V.

Also, as shown in the graph 500, the minimum IM3 of the second plot 504 of the high linearity VVA is (about 55 dBc) and is greater than the minimum IM3 of the first plot 502 of the VVA (about 49 dBc). Because the second plot 504 of the high linearity VVA has a greater minimum IM3 magnitude in dBc than the first plot 502, the high linearity VVA of the second plot 504 exhibits superior linearity performance including higher IP3 point as compared to that of the VVA of the first plot 502.

Applications

Devices employing the above described high linearity voltage variable attenuators can be implemented into various electronic devices. Examples of the electronic devices can include, but are not limited to, consumer electronic products, parts of the consumer electronic products, electronic test equipment, etc. For example, the high linearity voltage variable attenuators described herein can be included on an integrated circuit, such as a monolithic microwave integrated circuit (MMIC), including radio frequency and/or microwave circuits, such as power amplifiers, low noise amplifiers, voltage controlled oscillators, mixers, tuners, resonators, and/or switches. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) system having controllable attenuation, the RF system comprising:
a voltage variable attenuator (VVA) comprising:
an input terminal;
an output terminal;
a control circuit configured to control an amount of attenuation along a signal path through the VVA between the input terminal and the output terminal, wherein the control circuit is configured to generate a first control voltage and a first complementary control voltage that changes inversely with respect to the first control voltage;
a first shunt circuit electrically connected in shunt to the signal path, wherein the first shunt circuit comprises at least one n-type field effect transistor (NFET) having a gate biased by the first control voltage, wherein the at least one NFET of the first shunt circuit comprises two or more NFETs electrically connected in series between a node of the signal path and a first DC voltage; and
a second shunt circuit electrically connected in shunt to the signal path, wherein the second shunt circuit comprises at least one p-type field effect transistor (PFET) having a gate biased by the first complementary control voltage.

2. The RF system of claim 1, wherein the at least one PFET of the second shunt circuit comprises two or more PFETs electrically connected in series between the node of the signal path and the first DC voltage.

3. The RF system of claim 1, wherein the control circuit is configured to generate the first complementary control voltage to have a voltage level about equal to a difference between a DC voltage and the first control voltage.

4. The RF system of claim 1, wherein the at least one NFET has a channel biased by a first DC voltage, wherein the VVA further includes a plurality of DC blocking capacitors configured to provide DC blocking to the second shunt circuit, wherein the at least one PFET has a channel biased by a second DC voltage different than the first DC voltage.

5. The VVA of claim 1, wherein the control voltage and the complementary control voltage comprise analog signals.

6. The RF system of claim 1, wherein the first shunt circuit provides a first impedance to the signal path and the second shunt circuit provides a second impedance to the signal path, wherein the first impedance and the second impedance operate in parallel to provide a combined impedance, wherein a change in amplitude of an RF signal received at the input terminal induces an impedance variation in the combined impedance that is less than an induced impedance variation of the first impedance and less than an induced impedance variation of the second impedance.

7. The RF system of claim 6, wherein the at least one PFET comprises two or more PFETs electrically connected in series, wherein the first impedance is based on a sum of two or more channel resistances of the two or more NFETs, and wherein the second impedance is based on a sum of two or more channel resistances of the two or more PFETs.

8. The RF system of claim 1, wherein the control circuit is configured to receive an analog attenuation control signal, wherein the control circuit is configured to generate the first control voltage and the first complementary control voltage based on the analog attenuation control signal.

9. The RF system of claim 8, wherein one of the first control voltage or the first complementary control voltage varies substantially proportionate to the analog attenuation control signal, and wherein the other of the first control voltage or the first complementary control voltage varies substantially inversely proportionate to the analog attenuation control signal.

10. The RF system of claim 8, wherein the control circuit comprises a plurality of amplifiers configured to generate the first control voltage and the first complementary control voltage based on the analog attenuation control signal.

11. The RF system of claim 8, further comprising a power amplifier and a feedback loop configured to generate the analog attenuation control signal based on an output power of the power amplifier.

12. A radio frequency (RF) system having controllable attenuation, the RF system comprising:
a voltage variable attenuator (VVA) comprising:
an input terminal;
an output terminal;
a control circuit configured to control an amount of attenuation along a signal path through the VVA between the input terminal and the output terminal, wherein the control circuit is configured to generate a first control voltage and a first complementary control voltage that changes inversely with respect to the first control voltage;
a first shunt circuit electrically connected in shunt to the signal path, wherein the first shunt circuit comprises at least one n-type field effect transistor (NFET) having a gate biased by the first control voltage; and
a second shunt circuit electrically connected in shunt to the signal path, wherein the second shunt circuit comprises at least one p-type field effect transistor (PFET) having a gate biased by the first complementary control voltage;
wherein the VVA further comprises an inductor in the signal path, wherein the inductor is electrically connected between a first signal node of the signal path and a second signal node of the signal path, wherein the first and second shunt circuits are electrically connected to the first signal node.

13. The RF system of claim 12, wherein the control circuit is further configured to generate a second control voltage and a second complementary control voltage that changes inversely with respect to the second control voltage, wherein the VVA further comprises a third shunt circuit electrically connected to the second signal node and biased by the second control voltage, and wherein the VVA further comprises a fourth shunt circuit electrically connected to the second signal node and biased by the second complementary control voltage.

14. The VVA of claim 12, wherein the control voltage and the complementary control voltage comprise analog signals.

15. A voltage variable attenuator (VVA) for radio frequency signals comprising:
a control circuit configured to control an amount of attenuation of the VVA, wherein the control circuit is configured to generate a control voltage and a complementary control voltage that changes inversely with respect to the control voltage; and
a shunt attenuation circuit comprising:
a first shunt circuit electrically connected between a signal node and a first DC voltage, wherein the first shunt circuit comprises at least one n-type field effect transistor of a first type having a gate biased by the control voltage;

a first DC blocking capacitor electrically connected between the signal node and a first internal node;

a second shunt circuit electrically connected between the first internal node and a second internal node, wherein the second shunt circuit comprises at least one field effect transistor of a second type opposite to the first type having a gate biased by the complementary control voltage; and a second DC blocking capacitor electrically connected between the second internal node and the first DC voltage.

16. The VVA of claim 15, wherein the at least one field effect transistor of the first type of the first shunt circuit comprises two or more n-type field effect transistors electrically connected in series, and wherein the at least one field effect transistor of the second type of the second shunt circuit comprises two or more p-type field effect transistors electrically connected in series.

17. The VVA of claim 15, wherein the control voltage and the complementary control voltage comprise analog signals.

18. The VVA of claim 15, wherein the control circuit is configured to control the amount of attenuation along a signal path through the VVA, wherein the VVA further comprises an inductor in the signal path.

19. The VVA of claim 15, wherein the shunt attenuation circuit further comprises a DC bias circuit configured to bias the first internal node and the second internal node with a second DC voltage.

20. The VVA of claim 19, wherein the control circuit is configured to receive an analog attenuation control signal, wherein the control circuit is configured to generate the control voltage and the complementary control voltage based on the analog attenuation control signal, and wherein the control circuit is configured to generate the complementary control voltage to have a voltage level about equal to a difference between the second DC voltage and the control voltage.

* * * * *

UNITED STATES PATENT AND TRADEMARK OFFICE
CERTIFICATE OF CORRECTION

Page 1 of 1

PATENT NO. : 9,882,549 B2
APPLICATION NO. : 15/050875
DATED : January 30, 2018
INVENTOR(S) : Ahmed Mohammad Ashry Othman It is certified that error appears in the above-identified patent and that said Letters Patent is hereby corrected as shown below:

In Column 16 at Line 65, in Claim 15, after "one" delete "n-type".

Signed and Sealed this
First Day of May, 2018

Andrei Iancu
*Director of the United States Patent and Trademark Office*